US012635570B2

(12) United States Patent
Fiteri et al.

(10) Patent No.: US 12,635,570 B2
(45) Date of Patent: May 19, 2026

(54) STACKED SEMICONDUCTOR ASSEMBLY FOR DIRECT MOUNTING TO A PRINTED CIRCUIT BOARD

(71) Applicant: NEXPERIA B.V., Nijmegen (NL)

(72) Inventors: Zainul Fiteri, Nijmegen (NL); Stefano Dalcanale, Nijmegen (NL)

(73) Assignee: Nexperia B.V., Nijmegen (NL)

( * ) Notice: Subject to any disclaimer, the term of this patent is extended or adjusted under 35 U.S.C. 154(b) by 790 days.

(21) Appl. No.: 17/966,205

(22) Filed: Oct. 14, 2022

(65) Prior Publication Data

US 2023/0124758 A1    Apr. 20, 2023

(30) Foreign Application Priority Data

Oct. 14, 2021    (EP) ..................................... 21202592

(51) Int. Cl.
*H10W 90/00*        (2026.01)
*H10W 70/63*        (2026.01)

(52) U.S. Cl.
CPC ......... *H10W 90/00* (2026.01); *H10W 70/635* (2026.01)

(58) Field of Classification Search
CPC . H01L 25/074; H01L 23/49827; H01L 25/18; H01L 25/50; H01L 24/06; H01L 24/29; H01L 24/32; H01L 24/33; H01L 24/83; H01L 25/0652; H01L 25/0655; H01L 2224/04026; H01L 2224/0603; H01L 2224/06181; H01L 2224/291; H01L 2224/2919

See application file for complete search history.

(56) References Cited

U.S. PATENT DOCUMENTS

| | | | |
|---|---|---|---|
| 2017/0092621 A1* | 3/2017 | Das .................. | H01L 23/53238 |
| 2020/0098621 A1 | 3/2020 | Bharath et al. | |
| 2020/0365593 A1* | 11/2020 | Chen ...................... | H01L 25/50 |
| 2021/0296218 A1 | 9/2021 | Yandoc et al. | |

OTHER PUBLICATIONS

Extended European Search Report for corresponding European application EP21202592.8. 8 pages dated Apr. 4, 2022.

* cited by examiner

*Primary Examiner* — Thanh Y. Tran
(74) *Attorney, Agent, or Firm* — Ruggiero McAllister & McMahon LLC

(57) ABSTRACT

The present disclosure is directed to the stacking of semiconductor structures, such as dies, and the stacked semiconductor assembly is suitable to be directly mounted to a Printed Circuit Board, PCB. The present disclosure allows for a small sized stacked semiconductor assembly utilizing both the MOSFET and the HEMT in a single assembly.

18 Claims, 4 Drawing Sheets

STACKED SEMICONDUCTOR ASSEMBLY FOR DIRECT MOUNTING TO A PRINTED CIRCUIT BOARD

CROSS REFERENCE TO RELATED APPLICATION

This application claims the benefit under 35 U.S.C. § 119(a) of European Application No. 21202592.8 filed Oct. 14, 2021, the contents of which are incorporated by reference herein in their entirety.

BACKGROUND OF THE DISCLOSURE

1. Field of the Disclosure

The present disclosure is directed to stacking of semiconductor structures, i.e. dies, such that the stacked semiconductor assembly is made suitable to be directly mounted to a Printed Circuit Board, PCB.

2. Description of the Related Art

Flip chip, also known as controlled collapse chip connection, is a known method for interconnecting a semiconductor structure, i.e. a die, to an external circuitry for example on a Printed Circuit Board, PCB. The method uses solder bumps that have been deposited on the pads present on the semiconductor structure.

The solder bumps are typically deposited on the pads of the die at the top side of a wafer during a final wafer processing step. In order to mount the semiconductor structure to an external circuit, i.e. a PCB, it is flipped over so that its top side faces down towards the PCB, and is then aligned so that its pads align with matching pads on the external circuit. Finally, the solder is reflowed to complete the interconnect.

The above is contrary to wire bonding, wherein the chip is mounted in an upright position and wires are welded onto the pads present on the semiconductor structure and lead frame contacts to interconnect the pads to the external circuit.

Processing a flip chip is similar to conventional Integrated Circuit, IC, fabrication, but additional steps are required. Near the end of the manufacturing process, the pads at the semiconductor structure are metalized to make them more receptive to solder. This process may consist of several treatments.

A small dot of solder may be deposited on each metalized pad. Next, the semiconductor structure may be cut out of the corresponding wafer just like it was done in prior solutions.

Finally, to attach the semiconductor structure to an external circuit, the semiconductor circuit is inverted, i.e. flipped, to assure that the solder dots can be placed, upside down, on the external circuit. The solder is then re-melted to assure an electrical connection, typically using a thermosonic bonding or alternatively reflow solder process.

One of the downsides of the flip chip method as described above is that it is not suitable to be used in combination with stacking of semiconductor structures.

SUMMARY

It is an object of the present disclosure to provide for a stacked semiconductor assembly comprising a first and a second semiconductor structure, wherein the stacked semiconductor assembly is suitable to be directly mounted to an external circuit.

It is a further object of the present disclosure to provide for associated Printed Circuit Boards, PCB's, and methods.

In a first aspect, there is provided a stacked semiconductor assembly, comprising:

a first semiconductor structure having a bottom side and a top side, wherein a plurality of contact pads of said first semiconductor structure are provided on said top side, a second semiconductor structure having a bottom side and a top side, wherein said second semiconductor structure comprises a contact pad at a bottom side of said second semiconductor structure and at least one contact pad at said top side of said second semiconductor structure, wherein said contact pad at said bottom side of said second semiconductor structure is mounted to one of said plurality of contact pads of said first semiconductor structure, an electrical conductive interposer, having an interposer pad on a top side thereof, and mounted to another one of said plurality of contact pads of said first semiconductor structure thereby enabling an electrical connection to said another one of said plurality of contact pads of said first semiconductor structure via said interposer pad, wherein said electrical conductive interposer is configured such that said at least one contact pad at said top side of said second semiconductor structure is flush with said interposer pad.

It was the insight of the inventors that the contact pads that are to be used for mounting the assembly to an external circuit are no longer flush with each other, which poses a problem. Contact pads present on the first semiconductor structure have a different height level compared to contact pads present on the second semiconductor structure.

The contact pads are to be flush with each other in order to assure that the stacked semiconductor assembly is directly mountable to an external circuit. The present disclosure provides for a solution by incorporating the electrical conductive interposer.

The underlying idea is that the thickness of the second semiconductor structure is substantially equal to the thickness of the electrical conductive interposer such that the contact pads, i.e. the pads that are to be mounted to the external circuit, are all flush to one another. The electrical conductive interposer may be considered as an electrical extension.

In the end, the contact pads are flush to one another. This means that the contact pads are in the same, two-dimensional, plane. This allows the stacked semiconductor assembly to be flipped and to be mounted to an external circuit.

The present disclosure is directed to a first semiconductor structure and a second semiconductor structure. The first semiconductor structure, i.e. a die, is thus separate from the second semiconductor structure.

A die, in the context of the present disclosure, may be considered as a small block of semiconducting material on which a given functional circuit is fabricated. Typically, integrated circuits are produced in large batches on a single wafer of electronic-grade silicon, EGS, or other semiconductor, such as GaAs, through processes such as photolithography. The wafer is cut into many pieces, wherein each of the pieces is called a die.

The present disclosure is especially useful for heterogenous semiconductor structures, wherein the first semiconductor structure is based on silicon and a second semiconductor structure is based on GaAs, or vice versa.

In an example, the first and the second semiconductor structure are any of:
a High-Electron-Mobility Transistor, HEMT;
a Metal Oxide Semiconductor, MOS, Field Effect Transistor, FET.

A High-Electron-Mobility Transistor, HEMT, is also known as a heterostructure Field Effect Transistor, FET, or a modulation-doped FET. Such a HEMT incorporates a junction between two materials with different band gaps, hence it is called a heterojunction, as the channel instead of a doped region which is typically the case for a Metal Oxide Semiconductor, MOS, FET. A commonly used material combination is GaAs with AlGaAs, although there might be wide variation, dependent on the intended application.

The MOSFET is a type of insulated-gate field-effect transistor that is fabricated by the controlled oxidation of a semiconductor, typically silicon. The voltage of the covered gate determines the electrical conductivity of the device. The ability to change conductivity with the amount of applied voltage can be used for a variety of applications like amplifying or switching electronic signals.

Like other FETs, HEMTs are used in integrated circuits as digital on-off switches. FETs can also be used as amplifiers for large amounts of current using a small voltage as a control signal. Both of these uses are made possible by the FET's unique current-voltage characteristics. HEMT transistors are able to operate at higher frequencies than ordinary transistors, up to millimetre wave frequencies, and are used in high-frequency products such as cell phones, satellite television receivers, voltage converters, and radar equipment. They are widely used in satellite receivers, in low power amplifiers and in the defence industry.

The present disclosure allows for a small sized stacked semiconductor assembly utilizing both the MOSFET and the HEMT in a single assembly.

In an example, the interposer comprises electrically conductive vias for connecting said interposer pad to said another one of said plurality of contact pads of said first semiconductor structure.

The electrically conductive vias ensure that there is a good electrical connection between the top side of the interposer and the bottom side of the interposer. The via may be of any conductive material, for example copper, gold or any other type of metal.

In a further example, the electrical conductive interposer comprises an interposer substrate, being any of:
Through-Silicon-Vias, TSV;
Through-Glass-Vias, TGV;
Conductive metal plate;
Ceramics.

A through-silicon via or through-chip via is a vertical electrical connection, i.e. a via, that passes completely through the semiconductor structure, i.e. the silicon wafer or die.

In accordance with the present disclosure, a through-glass via, TGV, provides for a vertical electrical connection through a glass substrate.

In another example, the second semiconductor structure and said electrical conductive interposer is mounted to said first semiconductor structure via any of:
silver sintering;
soldering, and
conductive die attach film, CDAF.

In a further example, the first semiconductor structure is a High-Electron-mobility transistor, HEMT semiconductor structure and wherein said second semiconductor structure is a Field Effect Transistor, FET semiconductor structure,
wherein said plurality of contact pads of said HEMT semiconductor structure comprise a gate pad, a source pad and a drain pad, respectively,
wherein said contact pad at said bottom side of said second semiconductor structure comprises a drain pad of said FET semiconductor structure, wherein said FET semiconductor structure comprises a gate pad and a source pad provided at said top side of said FET semiconductor structure,
wherein said source pad of said HEMT semiconductor structure is mounted to said drain pad of said FET semiconductor structure,
wherein said electrical conductive interpose is an electrical conductive gate pad interposer mounted to said gate pad of said HEMT semiconductor structure,
wherein said stacked semiconductor assembly further comprises
another electrical conductive interposer, being an electrical conductive drain pad interposer mounted to said drain pad of said HEMT semiconductor structure.

The above described example described a detailed composition of a MOSFET that is stacked on top of a HEMT, using two conductive interposers. The first electrical conductive interposer is connected to the gate of the HEMT and the second interposer is connected to the drain of the HEMT.

The above allows the gate and the drain of the HEMT to be made available at a same level, i.e. height, as the source and the gate pads of the MOSFET. All contact pads are therefore flush with one another, i.e. they are in the same two dimensional plane.

In a second aspect of the present disclosure, there is provided a method of manufacturing a stacked semiconductor assembly in accordance with any of the previous claims, wherein said method comprises the steps of:
providing said first semiconductor structure;
mounting said second semiconductor on said first semiconductor structure via said contact pad at said bottom side of said second semiconductor structure to said one of said plurality of contact pads of said first semiconductor structure;
mounting said electrical conductive interposer to said another one of said plurality of contact pads of said first semiconductor structure.

In an example, the step of mounting said second semiconductor and said electrical conductive interposer comprises any of:
silver sintering;
soldering, and
conductive die attach film, CDAF.

In a third aspect of the present disclosure, there is provided a printed circuit board, PCB, comprising a stacked semiconductor assembly in accordance with any of the previous examples, wherein said stacked semiconductor is mounted to said PCB via said at least one contact pad at said top side of said second semiconductor structure and said interposer pad that is flush with said at least one contact pad at said top side of said second semiconductor structure.

In another aspect of the present disclosure, there is provided a method of manufacturing a printed circuit board, PCB, comprising a stacked semiconductor assembly in accordance with claim 9, wherein said method comprises the steps of:

flipping said stacked semiconductor assembly such that said top side of said first semiconductor structure is facing towards said PCB, and mounting said stacked semiconductor assembly to said PCB via said at least one contact pad at said top side of said second semiconductor structure and said interposer pad.

The definitions and advantages of the first aspect of the present disclosure are also applicable to any of the other aspects of the present disclosure.

The above and other aspects of the disclosure will be apparent from and elucidated with reference to the examples described hereinafter.

DETAILED DESCRIPTION

Figure 1:
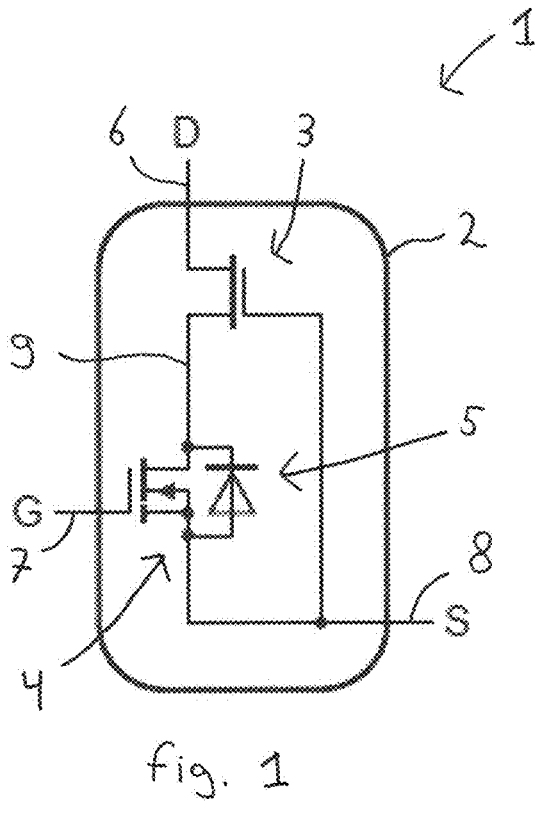
FIG. 1 discloses an example of a High-Electron-Mobility transistor, HEMT cascaded in series with a Metal Oxide Semiconductor, MOS, Field Effect Transistor, FET and provided in a package.

It is noted that in the description of the figures, same reference numerals refer to the same or similar components performing a same or essentially similar function.

FIG. 1 discloses an example of a High-Electron-Mobility transistor, HEMT cascaded in series with a Metal Oxide Semiconductor, MOS, Field Effect Transistor, FET and provided in a package.

The present disclosure is elucidated, with respect to the figures, in more detail in an example of an HEMT in combination with an MOSFET. It is noted that the present disclosure may be applicable to all sorts of semiconductor structures, and all kinds of combination of semiconductor structures and is therefore not limited to the HEMT in combination with the MOSFET.

FIG. 1 discloses a semiconductor component 1 of a so-called HEMT 3 cascaded in series with a MOSFET 4. The semiconductor component 2 is provided in a package suitable for mounting on an external circuit, for example a printed circuit board, PCB.

The semiconductor package 2 may be any of a metal, plastic, glass, or ceramic casing. The individual components 3, 4 are fabricated on semiconductor wafers before being diced into dies, tested, and packaged. The package provides a means for connecting it to the external environment, such as printed circuit board, via leads such as lands, balls, or pins. The package also provides for protection against threats such as mechanical impact, chemical contamination, and light exposure.

In addition to the above, the package may help dissipate heat produced by the semiconductor component 1, with or without the aid of a heat spreader. There are thousands of package types in use. Some are defined by international, national, or industry standards, while others are particular to an individual manufacturer.

Three external pins are provided, being the so-called Drain 6, the Gate "G" 7 and the Source 8. The Drain "D" 6 is the drain of the HEMT 3. The source "S" 8 is the source of the MOSFET 4, which source 8 is directly, internally, connected to the gate of the HEMT 3. Further, the source of the HEMT 3 is, internally, connected 9 to the drain of the MOSFET 4. Finally, the body diode 5 of the MOSFET 4 is depicted.

Figures 2A, 2B:
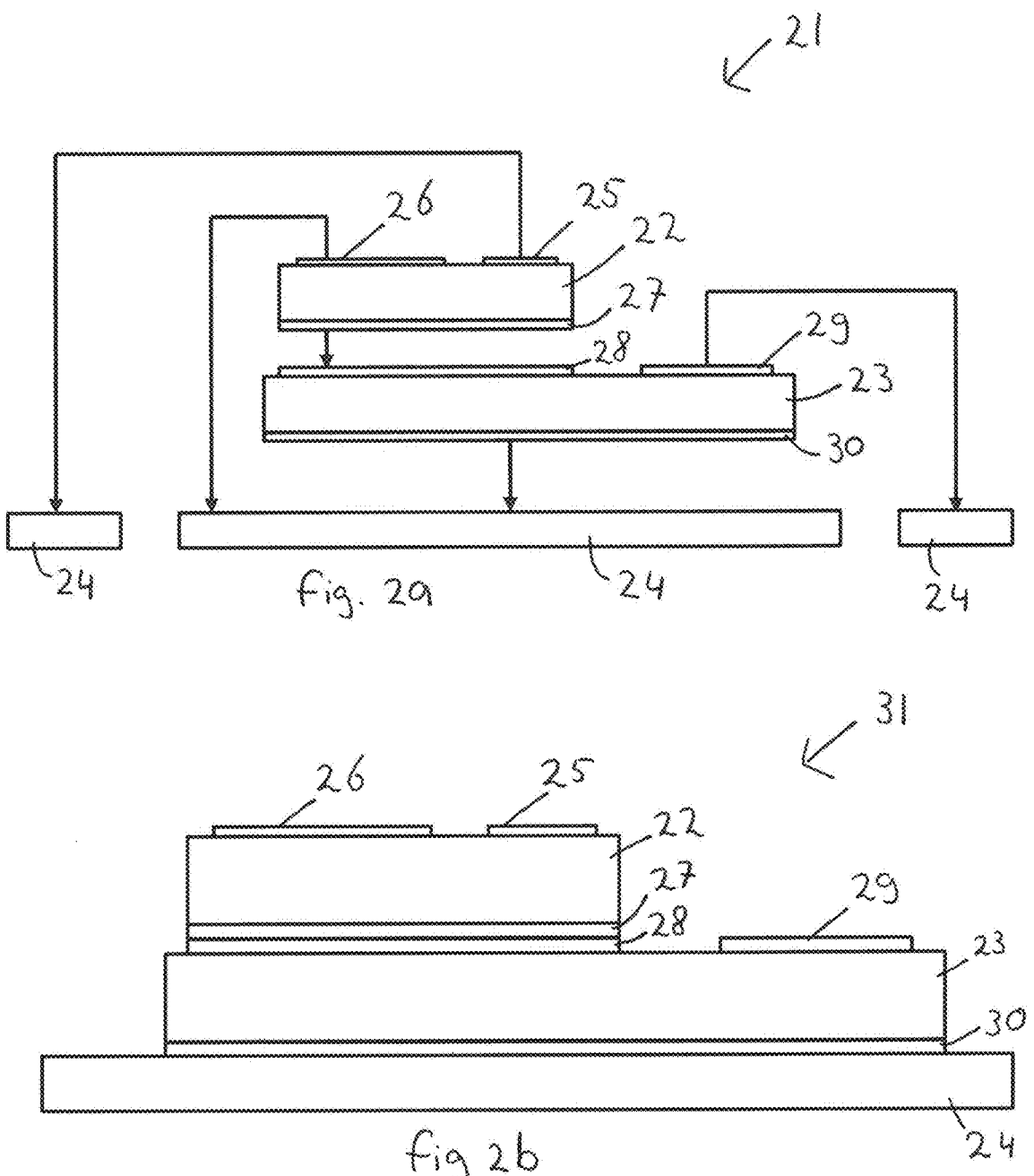
FIG. 2a discloses a prior art solution for connecting two bare semiconductor structures to one another, in an unassembled state.
FIG. 2b discloses a prior art solution for connecting two bare semiconductor structures to one another, in an assembled state.

FIG. 2a discloses a prior art solution 21 for connecting two bare semiconductor structures to one another, in an unassembled state.

The semiconductor structure 22 shown at the top is the MOSFET. The MOSFET 22 has a source terminal 26, a gate terminal 25 and a drain terminal 27. The semiconductor structure 23 shown directly below the MOSFET is the so-called HEMT 23. The HEMT has a source terminal 28, a drain terminal 29 and a gate terminal 30.

The drain terminal 27 of the MOSFET 22 is directly connected to the source terminal 28 of the HEMT 23, as is also shown in FIG. 1. The bottom frame 24 consists of three conductive parts. The left part is arranged to provide a connection to the gate terminal 25 of the MOSFET 25. The centre part is arranged to provide a connection to the source terminal 26 of the MOSFET 22 and also to the gate terminal 30 of the HEMT 23. The right part is arranged to provide for a connection to the drain terminal of the HEMT 23.

FIG. 2b discloses the prior art solution 31 for connecting two bare semiconductor structures to one another, in an assembled state.

The above entails that the current cascode connectivity creates relatively long electrical paths and thus increases parasitic inductances.

The stacking process as shown in FIG. 2 requires multi-layers of solders and thus increases thermal resistance.

Figure 3:
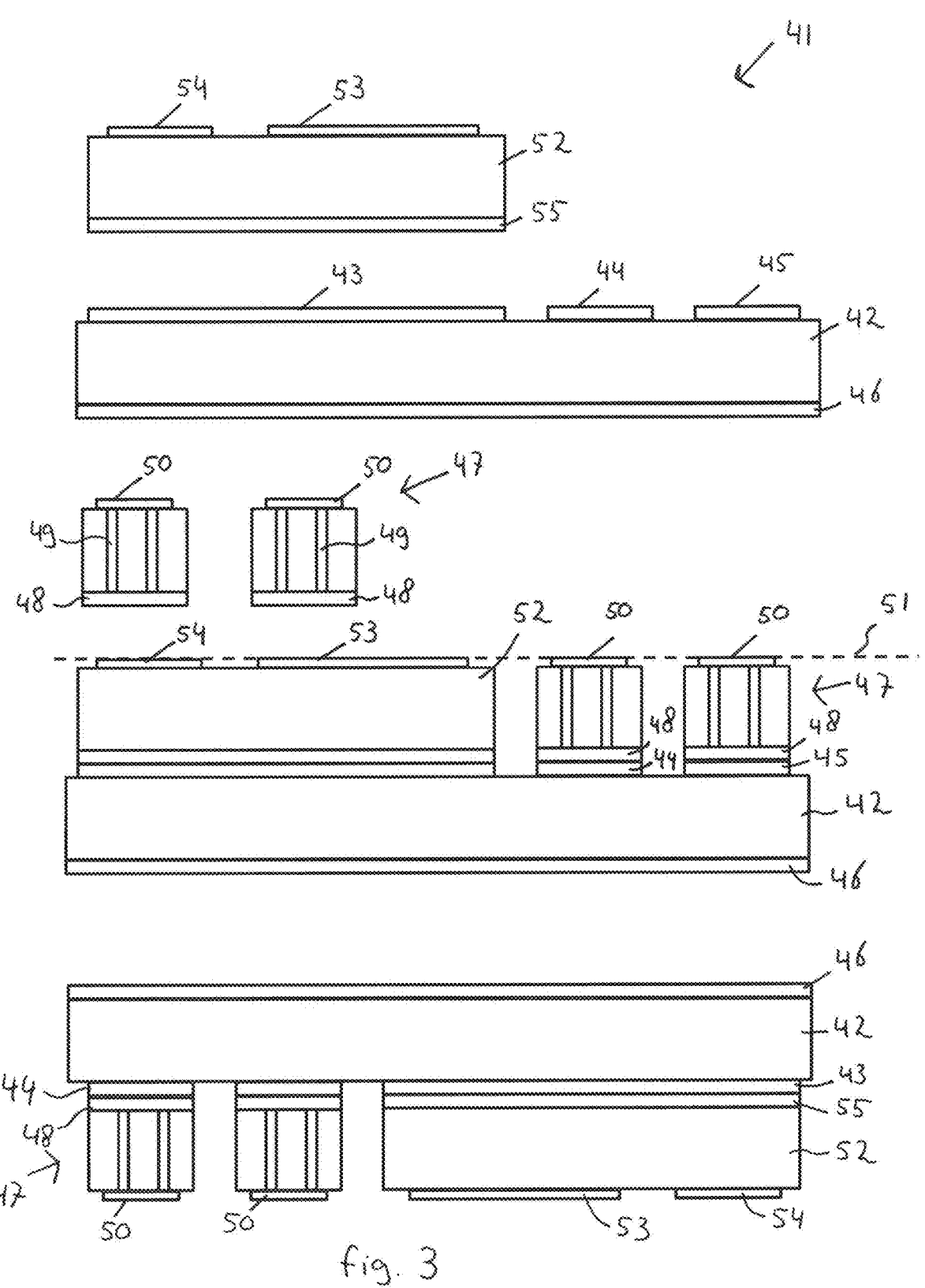
FIG. 3 discloses a solution for connecting bare semiconductor structures to one another in accordance with the present disclosure.

There is also a possibility for a thermal mismatch between the bottom frame 24, any moulding compound and the semiconductor structures 22, FIG. 3 discloses a solution for connecting bare semiconductor structures to one another in accordance with the present disclosure.

The top semiconductor structure is the MOSFET 52 having its gain terminal 54 and its source terminal 53 provided at a top side thereof. The drain terminal 55 is provided at a bottom side of the MOSFET 52.

The semiconductor structure provided directly below the MOSFET 52 is the HEMT 42. In contrast to the HEMT shown in FIGS. 2a and 2b, the HEMT 42 shown in FIG. 3 has different locations for its terminals. All three terminals, i.e. the gate terminal 44, the source terminal 43 and the drain terminal 45, are all provided at a top side of the HEMT 42. The bottom side is merely the back metal 46.

This is beneficial as this allows the use of electrical conductive interposers 47. The interposes are used for creating an electrical connection to the gate terminal 44 and the drain terminal 45 of the HEMT, and for making electrical connections to these two terminals 44, 45 available at the same height level as the gate terminal 54 and the source terminal 53 of the MOSFET 52. This is indicated by the reference numeral 51.

The electrical conductive interposers 47 are used for creating an electrical connection from its bottom side 48 to the top side 50 via conductive material 49. The electrical conductive interposers 47 may be any of Through Silicon Via, TSV, Through Glass Via, TGV or may comprise a High conductive metal plate like copper or aluminium or may comprise ceramics like aluminium nitride, alumina or LTTC.

The interposers 47 are thus arranged to bring the HEMT's gate and drain to the same plane as the MOSFET's gate and source.

The above allows the resulting stacked semiconductor assembly to be directly mounted to an external circuit, for example a printed circuit board. The stacked semiconductor assembly may be flipped, and the corresponding terminals may be directly mounted onto the printed circuit board using, for example, a soldering process.

The electrical conductive interposers are thus configured such that the contact pads at the top side of the HEMT are made flush with the contact pads of the MOSFET. That is, they reside in the same two-dimensional plane such that they can be mounted to the printed circuit board.

As such, there is no longer a package needed for housing the semiconductor structures, and for providing a connection to the PCB. BY assuring that the external connections are level to one another, the stacked semiconductor is enabled to be directly mounted to an external circuit without the use of a package.

Figure 4:
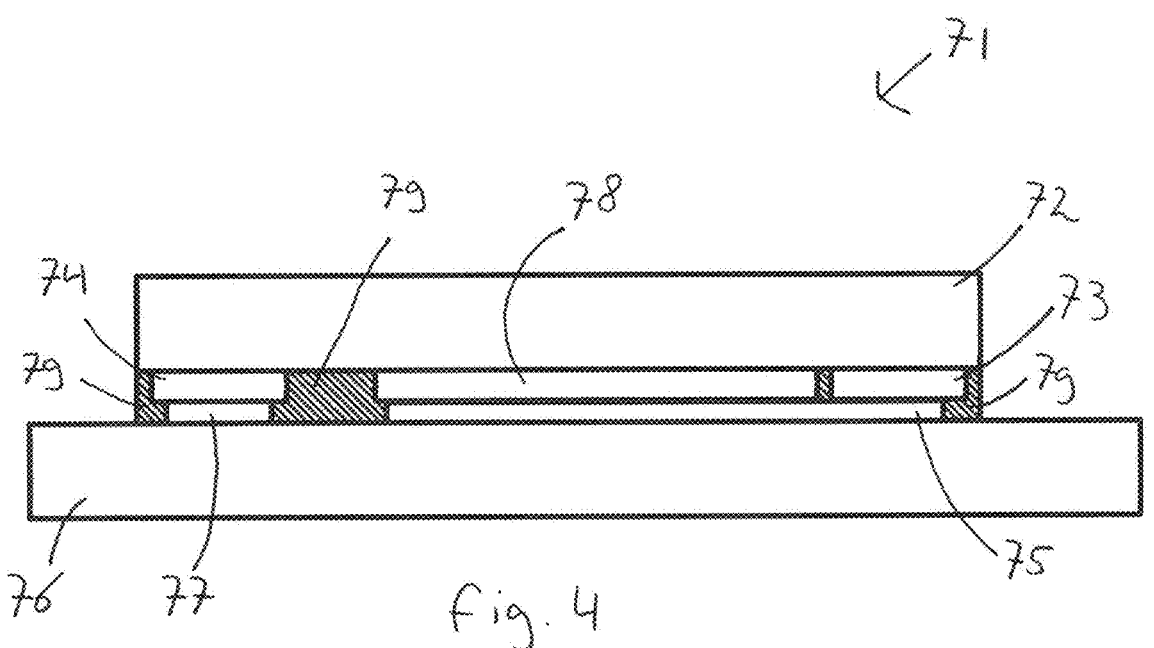
FIG. 4 discloses a solution for connecting bare semiconductor structures to one another, in an assembled state, in accordance with the present disclosure.

FIG. 4 discloses a solution for connecting bare semiconductor structures to one another, in an assembled state, in accordance with the present disclosure.

The stacked semiconductor assembly is indicated with reference numeral 71, and the stacked semiconductor assembly 71 is mounted to a printed circuit board 76.

The first semiconductor structure is the HEMT 72 and the second semiconductor structure is the MOSFET 78. Two electrical conductive interposers 73, 74 are provided for making electrical connections to terminals present at the HEMT available at the same level as the terminals provided a the MOSFET 78.

All terminals are then mounted to the printed circuit board 76 using solder as indicated with the reference numerals 75 and 77.

In order to assure that there is sufficient creepage between the terminals, a non-electrical conductive material may be provided in between the terminals that are to be electrically separated. The non-electrical conductive material is indicated with reference numeral 79.

The non-conductive electrical material may be an underfill material, for example epoxy that is made for such a flip-chip process.

Other variations to the disclosed embodiments can be understood and effected by those skilled in the art in practicing the claimed disclosure, from a study of the drawings, the disclosure and the appended claims.

In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope thereof.

What is claimed is:

1. A stacked semiconductor assembly, comprising:
a first semiconductor structure having a bottom side and a top side; wherein the first semiconductor structure has a plurality of contact pads that are provided on the top side;
a second semiconductor structure having a bottom side and a top side;
wherein the second semiconductor structure comprises a contact pad at the bottom side of the second semiconductor structure and at least one contact pad at the top side of the second semiconductor structure;
wherein the contact pad at the bottom side of the second semiconductor structure is mounted to one of the plurality of contact pads of the first semiconductor structure;
an electrical conductive interposer having an interposer pad on a top side thereof, and mounted to another one of the plurality of contact pads of the first semiconductor structure thereby enabling an electrical connection to the another one of the plurality of contact pads of the first semiconductor structure via the interposer pad; and
wherein the electrical conductive interposer is configured so that the at least one contact pad at the top side of the second semiconductor structure is flush with the interposer pad.

2. The stacked semiconductor assembly in accordance with claim 1, wherein the first and second semiconductor structures are selected from the group consisting of: a High-Electron-Mobility transistor (HEMT), a Metal Oxide Semiconductor (MOS), and a Field Effect Transistor (FET).

3. The stacked semiconductor assembly in accordance with claim 1, wherein the interposer comprises electrically conductive vias for connecting the interposer pad to another one of the plurality of contact pads of the first semiconductor structure.

4. The stacked semiconductor assembly in accordance with claim 1, wherein the electrical conductive interposer comprises an interposer substrate, selected from the group consisting of: through-silicon-vias, (TSV), through-glass-vias, (TGV), conductive metal plates, and ceramics.

5. The stacked semiconductor assembly in accordance with claim 1, wherein the second semiconductor structure and the electrical conductive interposer are mounted to the first semiconductor structure via any method selected from the group consisting of: silver sintering, soldering, and conductive die attach film (CDAF).

6. The stacked semiconductor assembly in accordance with claim 1, wherein the first semiconductor structure is a High-Electron-mobility transistor (HEMT) semiconductor structure and wherein the second semiconductor structure is a Field Effect Transistor (FET) semiconductor structure;
wherein the plurality of contact pads of the HEMT semiconductor structure comprise a gate pad, a source pad and a drain pad, respectively;
wherein the contact pad at the bottom side of the second semiconductor structure comprises a drain pad of the FET semiconductor structure;
wherein the FET semiconductor structure comprises a gate pad and a source pad provided at the top side of the FET semiconductor structure;
wherein the source pad of the HEMT semiconductor structure is mounted to the drain pad of the FET semiconductor structure;
wherein the electrical conductive interposer is an electrical conductive gate pad interposer mounted to the gate pad of the HEMT semiconductor structure; and
wherein the stacked semiconductor assembly further comprises another electrical conductive interposer, being an electrical conductive drain pad interposer mounted to the drain pad of the HEMT semiconductor structure.

7. A printed circuit board (PCB) comprising a stacked semiconductor assembly in accordance with claim 1, wherein the stacked semiconductor is mounted to the PCB via the at least one contact pad at the top side of the second semiconductor structure and the interposer pad that is flush with the at least one contact pad at the top side of the second semiconductor structure.

8. The stacked semiconductor assembly in accordance with claim 2, wherein the interposer comprises electrically conductive vias for connecting the interposer pad to another one of the plurality of contact pads of the first semiconductor structure.

9. The stacked semiconductor assembly in accordance with claim 2, wherein the electrical conductive interposer comprises an interposer substrate, selected from the group consisting of: through-silicon-vias, (TSV), through-glass-vias, (TGV), conductive metal plates, and ceramics.

10. The stacked semiconductor assembly in accordance with claim 2, wherein the second semiconductor structure and the electrical conductive interposer are mounted to the first semiconductor structure via any method selected from the group consisting of: silver sintering, soldering, and conductive die attach film (CDAF).

11. The stacked semiconductor assembly in accordance with claim 2, wherein the first semiconductor structure is a High-Electron-mobility transistor (HEMT) semiconductor structure and wherein the second semiconductor structure is a Field Effect Transistor (FET) semiconductor structure;

wherein the plurality of contact pads of the HEMT semiconductor structure comprise a gate pad, a source pad and a drain pad, respectively;

wherein the contact pad at the bottom side of the second semiconductor structure comprises a drain pad of the FET semiconductor structure;

wherein the FET semiconductor structure comprises a gate pad and a source pad provided at the top side of the FET semiconductor structure;

wherein the source pad of the HEMT semiconductor structure is mounted to the drain pad of the FET semiconductor structure;

wherein the electrical conductive interpose is an electrical conductive gate pad interposer mounted to the gate pad of the HEMT semiconductor structure; and wherein the stacked semiconductor assembly further comprises another electrical conductive interposer, being an electrical conductive drain pad interposer mounted to the drain pad of the HEMT semiconductor structure.

12. The stacked semiconductor assembly in accordance with claim 3, wherein the interposer comprises electrically conductive vias for connecting the interposer pad to another one of the plurality of contact pads of the first semiconductor structure.

13. The stacked semiconductor assembly in accordance with claim 3, wherein the electrical conductive interposer comprises an interposer substrate, selected from the group consisting of: through-silicon-vias, (TSV), through-glass-vias, (TGV), conductive metal plates, and ceramics.

14. The stacked semiconductor assembly in accordance with claim 3, wherein the second semiconductor structure and the electrical conductive interposer is mounted to the first semiconductor structure via any method selected from the group consisting of: silver sintering, soldering, and conductive die attach film (CDAF).

15. The stacked semiconductor assembly in accordance with claim 3, wherein the first semiconductor structure is a High-Electron-mobility transistor (HEMT) semiconductor structure and wherein the second semiconductor structure is a Field Effect Transistor (FET) semiconductor structure;

wherein the plurality of contact pads of the HEMT semiconductor structure comprise a gate pad, a source pad and a drain pad, respectively;

wherein the contact pad at the bottom side of the second semiconductor structure comprises a drain pad of the FET semiconductor structure;

wherein the FET semiconductor structure comprises a gate pad and a source pad provided at the top side of the FET semiconductor structure;

wherein the source pad of the HEMT semiconductor structure is mounted to the drain pad of the FET semiconductor structure;

wherein the electrical conductive interpose is an electrical conductive gate pad interposer mounted to the gate pad of the HEMT semiconductor structure; and wherein the stacked semiconductor assembly further comprises another electrical conductive interposer, being an electrical conductive drain pad interposer mounted to the drain pad of the HEMT semiconductor structure.

16. A method of manufacturing a printed circuit board (PCB), comprising a stacked semiconductor assembly in accordance with claim 7, wherein the method comprises the steps of:

flipping the stacked semiconductor assembly so that the top side of the first semiconductor structure is facing towards the PCB; and mounting the stacked semiconductor assembly to the PCB via the at least one contact pad at the top side of the second semiconductor structure and the interposer pad.

17. A method of manufacturing a stacked semiconductor assembly in accordance with claim 1, wherein the method comprises the steps of:

providing the first semiconductor structure;

mounting the second semiconductor on the first semiconductor structure via the contact pad at the bottom side of the second semiconductor structure to the one of the plurality of contact pads of the first semiconductor structure; and mounting the electrical conductive interposer to the another one of the plurality of contact pads of the first semiconductor structure.

18. The method in accordance with claim 17, wherein the step of mounting the second semiconductor and the electrical conductive interposer comprises any method selected from the group consisting of: silver sintering, soldering, and conductive die attach film (CDAF).

* * * * *